(12) United States Patent
Ku

(10) Patent No.: US 7,832,897 B2
(45) Date of Patent: Nov. 16, 2010

(54) LED UNIT WITH INTERLOCKING LEGS

(75) Inventor: Chin-Long Ku, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 404 days.

(21) Appl. No.: 12/110,344

(22) Filed: Apr. 27, 2008

(65) Prior Publication Data

US 2009/0237936 A1 Sep. 24, 2009

(30) Foreign Application Priority Data

Mar. 19, 2008 (CN) .......................... 2008 1 0066121

(51) Int. Cl.
*F21S 2/00* (2006.01)
(52) U.S. Cl. .............................. 362/249.02; 362/249.06
(58) Field of Classification Search ............ 362/249.02, 362/249.06, 249.14, 249.15
See application file for complete search history.

(56) References Cited

U.S. PATENT DOCUMENTS 5,660,461 A * 8/1997 Ignatius et al. ......... 362/249.02
6,422,716 B2 * 7/2002 Henrici et al. ......... 362/249.02
2009/0244894 A1 * 10/2009 Zhou et al. ............. 362/249.02
2009/0316407 A1 * 12/2009 Lin ........................ 362/249.06

OTHER PUBLICATIONS

Elmer Carlson, "Electronic dominoes" Sep. 1967, Electronics Illustrated.*
Elenco Electronics, "Electronics Snap Circuits: Experiments 1-101", 2002, Elenco Electronics Inc.*

* cited by examiner

*Primary Examiner*—David V Bruce
(74) *Attorney, Agent, or Firm*—Frank R. Niranjan

(57) ABSTRACT

An LED unit includes a plurality of LEDs, each of which includes a base, an LED die mounted on the base, a pair of leads penetrating the base to electrically connect with the LED die, a plurality of legs extending radially from a periphery of the base, a plurality of cutouts defined in the base and an encapsulant enveloping the LED die. The pair of leads of each LED are joined to corresponding leads of adjacent LEDs to realize electrical connections of the LEDs, while the legs of each LED are fitted into corresponding cutouts of the bases of adjacent LEDs to realize mechanical connections of the LEDs.

20 Claims, 24 Drawing Sheets

US 7,832,897 B2

LED UNIT WITH INTERLOCKING LEGS

BACKGROUND OF THE INVENTION

1. Field of the Invention

The present invention relates to a light emitting diode (LED) unit, and more particularly to an LED unit incorporating a plurality of LEDs which can interlock with each other. Each LED has a self-locking capability.

2. Description of Related Art

LEDs have been available since the early 1960's. Because of the relatively high light-emitting efficiency of LEDs, nowadays LED usage has been increased in popularity in a variety of applications, e.g., residential, traffic, commercial, industrial settings. In such applications, in order to generate sufficient light from a single lamp, a large number of LEDs is often arranged closely on a printed circuit board in the single lamp; however, such close arrangement of the LEDs on the printed circuit board may cause heat generated by the LEDs not able to be timely dissipated since a poor heat conducting capability of the printed circuit board, which results in overheating or even malfunction of the LEDs. Thus, many attempts are tried in order to simultaneously give attention to both of the sufficient light and timely heat dissipation of the LED applications.

A type of LED lamp comprises a heat sink and a plurality of LEDs mounted on the heat sink. The heat sink sequentially forms a dielectric coating and circuit traces on a surface thereof, and defines a plurality of voids to separate the circuit traces. Each LED is mounted over a corresponding void, with two electrical leads thereof connected to two adjacent circuit traces; thus, when a current is input to the LEDs via the separated circuit traces to activate the LEDs, the heat generated by the operating LEDs can be rapidly dispersed to atmosphere via the heat sink.

However, the LEDs of this type LED lamp should be mounted on the heat sink along the circuit traces; in other words, an arrangement of the LEDs on the heat sink is confined by routes of the circuit traces. Therefore, the LEDs are unable to be freely mounted on the heat sink, but can only be positioned at predetermined locations. In addition, a shape and a size of the heat sink also restrict the number of the LEDs; if more LEDs are desired to be mounted in the lamp for emitting more light, the heat sink should be changed to a larger one to provide a more large mounting surface; such a change hinders the manufacturing and design flexibility.

What is needed, therefore, is an LED unit which can overcome the above-mentioned disadvantages.

SUMMARY OF THE INVENTION

An LED unit includes a plurality of LEDs, each of which includes a base, an LED die mounted on the base, a pair of leads inserted in the base to electrically connect the LED die to a power source, a plurality of legs extending radially from a periphery of the base, a plurality of cutouts defined in the base and an encapsulant enveloping the LED die. The pair of leads of each LED is connected to corresponding leads of adjacent LEDs to realize electrical connections between the LEDs, while the legs of each LED are fitted into corresponding cutouts of the bases of adjacent LEDs to realize mechanical connections between the LEDs. Therefore, in contrast to the conventional LED assembly, no printed circuit board is needed in the present invention since the plurality of LEDs can be electrically and mechanically connected together by themselves. Accordingly, a more flexibility in designing the LED unit is achieved.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
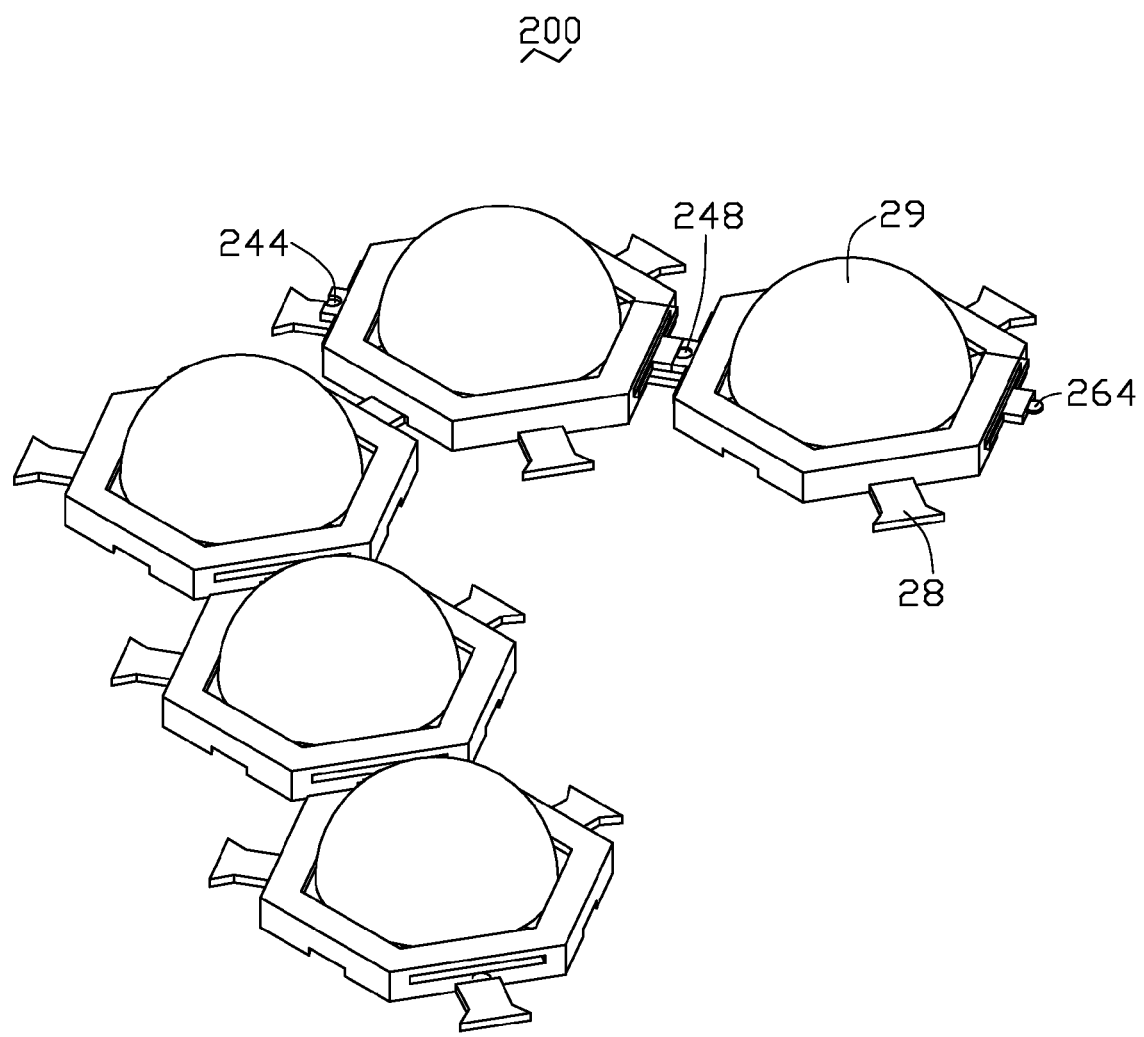
FIG. 1 is an assembled, isometric view of an LED unit of an LED assembly in accordance with a first embodiment of the present invention.
Figure 2:
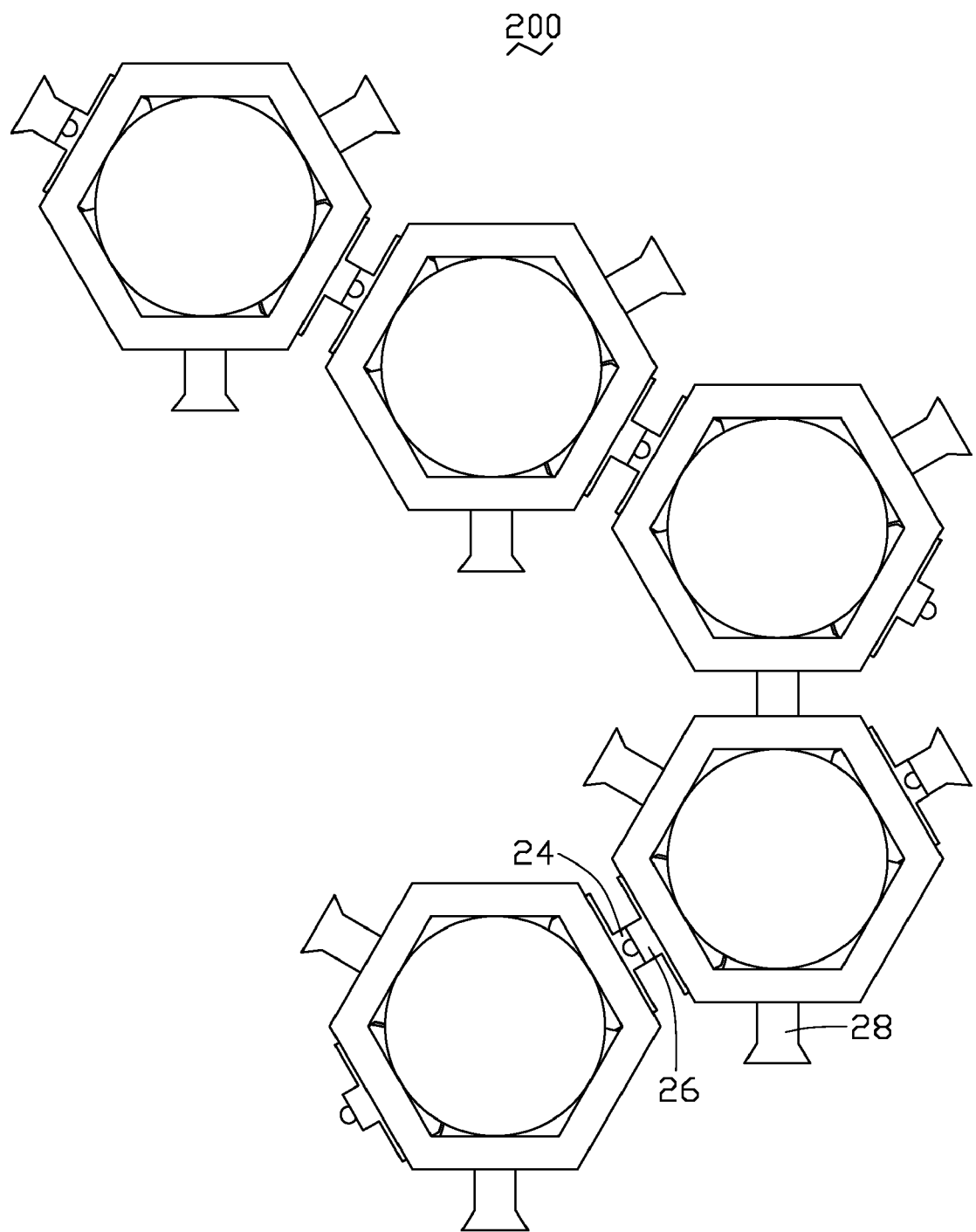
FIG. 2 is a top view of FIG. 1.
Figure 3:
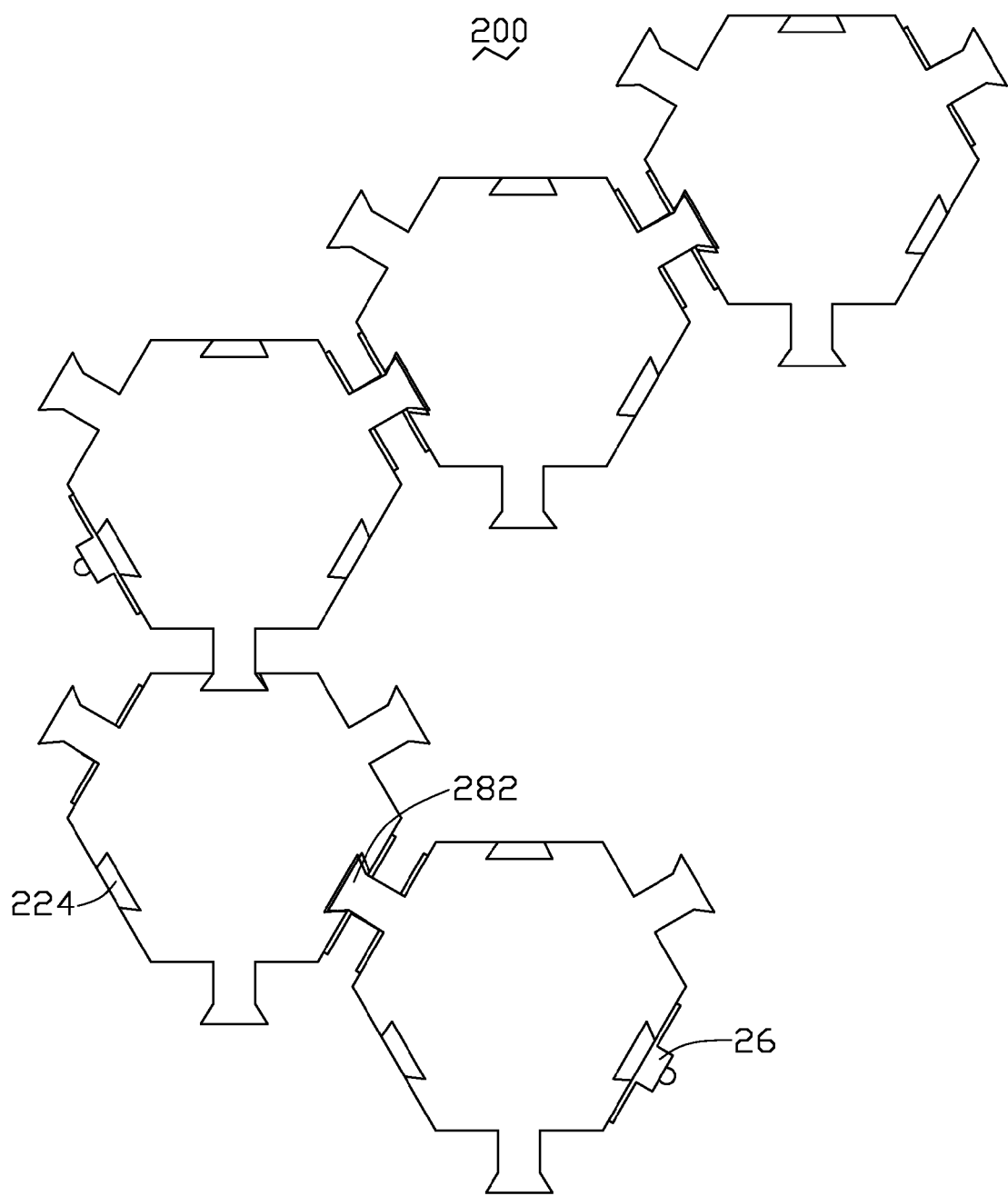
FIG. 3 is a bottom view of FIG. 1.
Figure 4:
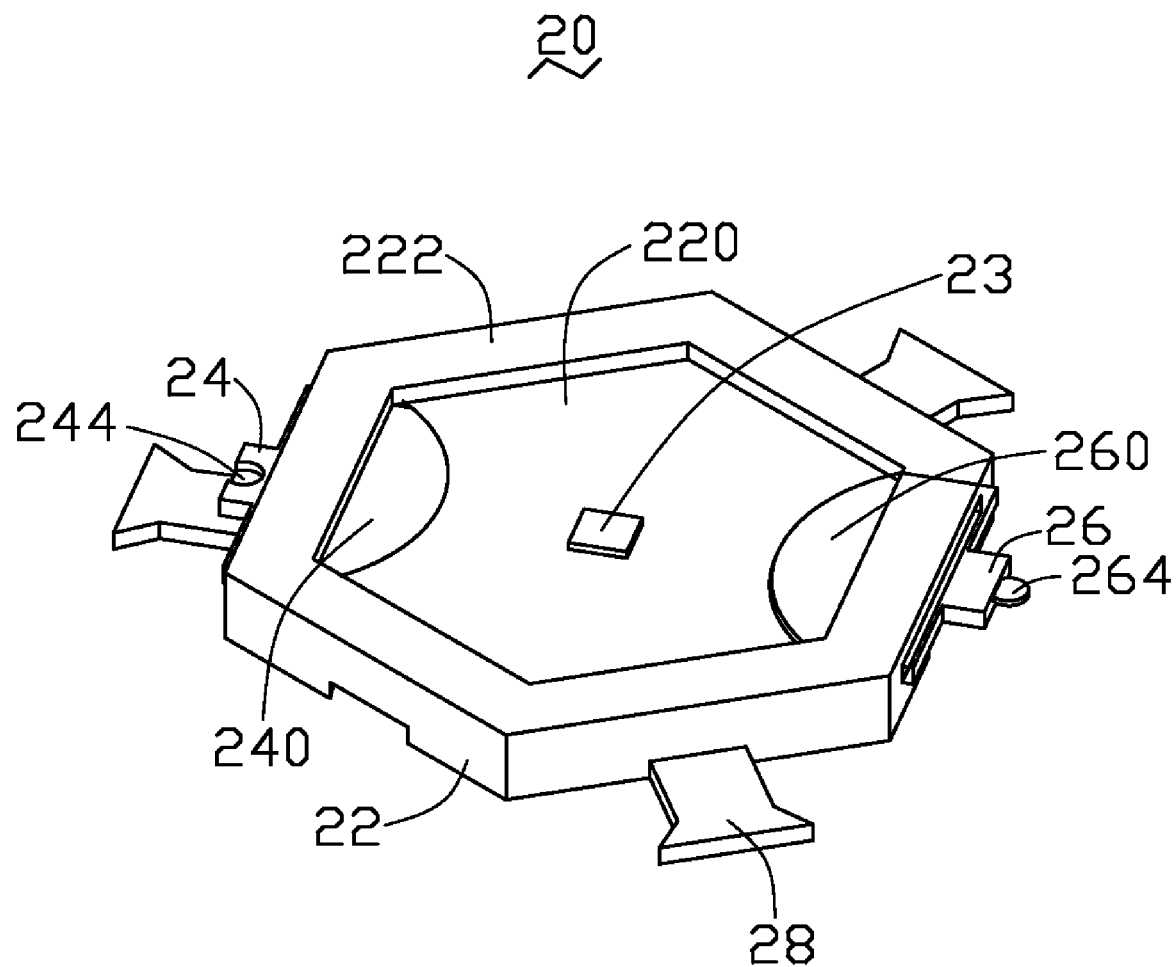
FIG. 4 is an enlarged, perspective view of an LED of the LED unit of FIG. 1, wherein an encapsulant of the LED is removed for clarity.
Figure 5:
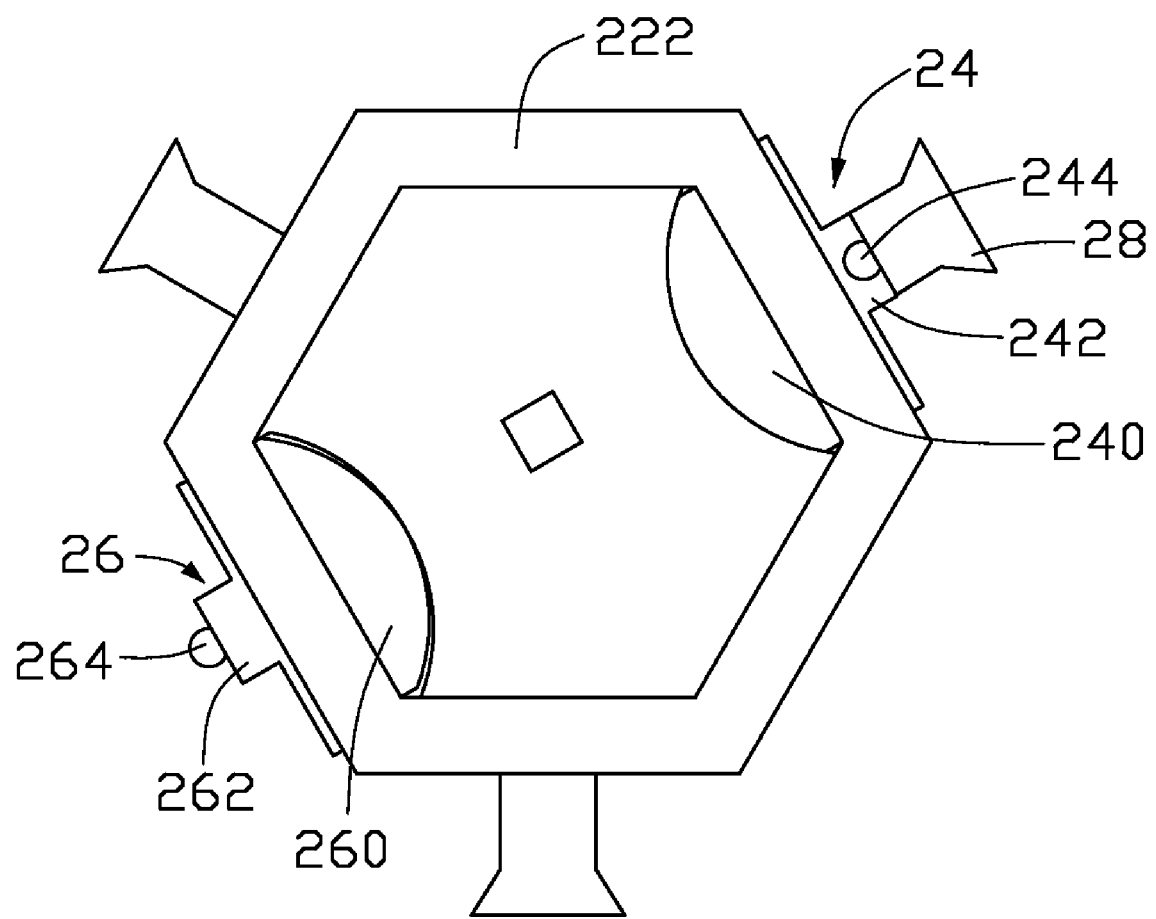
FIG. 5 is a top view of FIG. 4.
Figure 6:
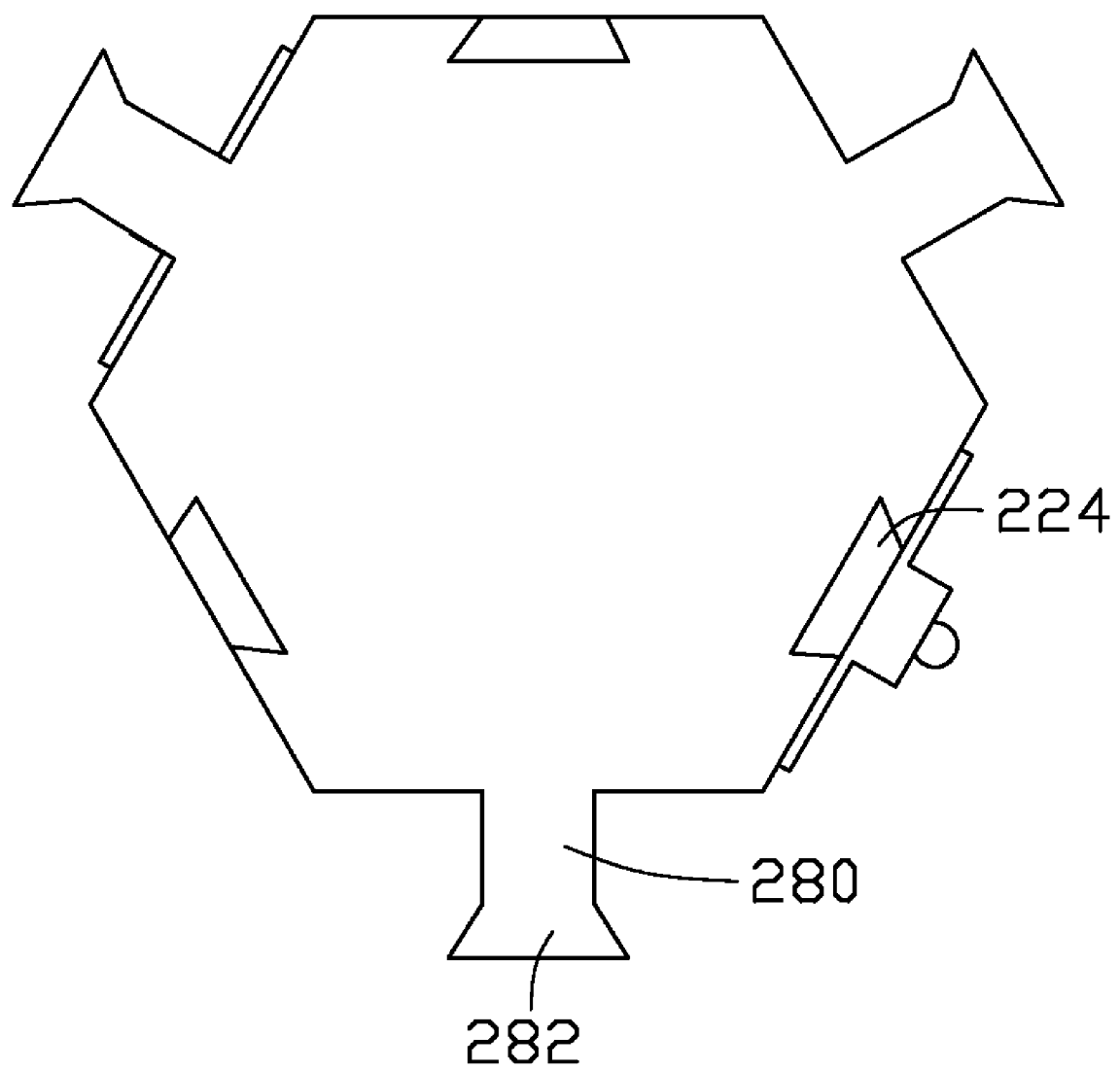
FIG. 6 is a bottom view of FIG. 4.
Figure 7:
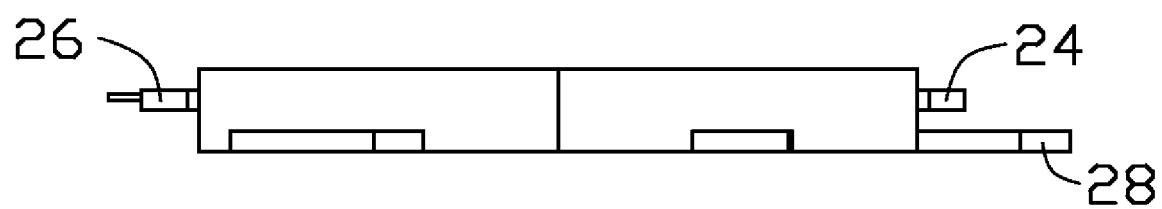
FIG. 7 is a side view of FIG. 4.
Figure 8:
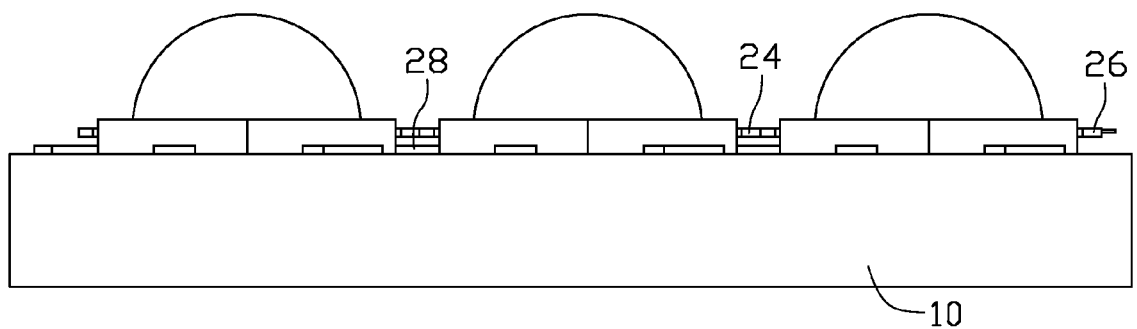
FIG. 8 is a side view of FIG. 1 with a substrate of the LED assembly placed below the LED unit.

Referring to FIGS. 1 and 8, an LED assembly in accordance with a first embodiment of the present invention comprises a substrate 10 and an LED unit 200 mounted on the substrate 10.

The substrate 10 is solid and entirely made of metal, such as copper, aluminum or an alloy thereof. The substrate 10 has a large and flat top surface for mounting the LED unit 200 thereon.

Also referring to FIGS. 4-7, the LED unit 200 is constructed by soldering a plurality of LEDs 20 together. Each LED 20 comprises a hexagonal base 22 defining a hexagonal cavity 220 therein, an LED die 23 adhesively attached in the cavity 220, a first electrode lead 24 and a second electrode lead 26 extending into the base 22 and electrically coupled to the LED die 23 via bonding wires (not shown), three legs 28 extending radially and outwardly from the base 22, and a hemispherical encapsulant 29 (see FIG. 1) encapsulating the LED die 23 therein. The base 22 is made of a material having a good heat conducting and electrically insulating capability, which is well known by those skilled in the related art, such as ceramic. The base 22 is in direct thermal contact with the top surface of the substrate 10 to direct heat generated by the LED die 23 to the substrate 10. The cavity 220 is defined in a central area of a top face of the base 22, being concentric with the base 22. A hexagonal ring-shaped step 222 is formed between the cavity 220 and a circumferential periphery of the base 22. The cavity 220 is used for receiving the LED die 23 therein, and retaining a bottom of the encapsulant 29 as well.

The first and second leads 24, 26 are substantially planar and parallel to the substrate 10; they are extended into the base 22 from two opposite sides of the base 22. Each of the first and second leads 24, 26 comprises a sheet 240, 260 penetrating through the step 222 to be located in the cavity 220, and a block 242, 262 (illustrated in FIG. 5) extending outwardly and horizontally from an extremity end of the sheet 240, 260 to be located outside a corresponding side of the base 22. The first and second leads 24, 26 are located above and hover over the substrate 20 when the LED 20 is mounted on the substrate 10 (see FIG. 8). Each sheet 240, 260 consists of an arc-shaped inner part (not labeled) at the bottom of the cavity 220 for electrically connecting to the LED die 23 via the bonding wires, a middle part (not shown) fixedly contained in the step 222 to secure the first and second leads 24, 26 in position, and a rectangular outer part (not labeled) slightly projecting from the step 222 to couple with the block 242, 262. An area of each sheet 240, 260 is far larger than that of each block 242, 262, to thereby enhance a reliability of the electrical connection of the first and second leads 24, 26 with the bonding wires. The block 242 of the first lead 24 forms an approximately circular groove 244 on a top face thereof, while the block 262 of the second lead 26 forms a nearly circular tab 264 projecting outwardly and horizontally from an extremity end thereof. As viewed from FIG. 1, the plurality of LEDs 20 are so electrically connected together that the grooves 244 of the first leads 24 of the LEDs 20 fittingly accommodate the tabs 264 of the second leads 26 of adjacent LEDs 20 therein. Since a current supplied to the LED die 23 travels through the first and second leads 24, 26 hovering over the substrate 10, wherein the substrate 10 is responsible for dissipating heat generated by the LED die 23 from the base 22, a current transferring pathway of the LED assembly is separated from a heat conducting pathway by a clearance between the substrate 10 and the first and second leads 24, 26; thus, an effect of the heat generated by the LED die 23 in influencing the current supplied to the LED die 23 can be reduced to an acceptable range. A depth of the groove 244 of the first lead 24 is slightly larger than a thickness of the tab 264 of the second lead 26, whereby when the tab 264 is retained into the groove 244, a space 248 is formed between a top of the tab 244 and an upper surface of an inner circumference of the first lead 24 defining the groove 264 (shown in FIG. 1). During soldering of the first and second leads 24, 26 together, the space 248 is capable of receiving excess solder (not shown) therein to prevent the excess solder from overflowing to the substrate 10.

The encapsulant 29 is partially retained into the cavity 220, and projects upwardly in a manner that a size of a cross-section thereof gradually decreases from bottom toward top. The encapsulant 29 envelops the LED die 23 and the inner parts of the sheets 240, 260 of the first and second leads 24, 26 therein, to protect the inner parts of the sheets 240, 260 and the LED die 23 from external influence, e.g., contamination and humidity. The encapsulant 29 is made of a transparent material, such as epoxy, glass, silicone or the like, to guide light emitted by the LED die 23 to radiate out of the LED 20. A fluorescent material (not shown), such as phosphor which is in particulate form, can be dotted in the encapsulant 29, to help the LED 20 to exhibit a certain colorful characteristic, when it is desired.

The three legs 28 are uniformly distributed around the circumferential periphery of the base 22 and located in vicinities of a bottom face of the base 22. The legs 28 are spaced from the first and second leads 24, 26 to avoid direct thermal contact therebetween. Each leg 28 is formed integrally with the base 22 and comprises a rectangular strip 280 and a trapezoidal locking portion 282 extending horizontally and outwardly from the strip 280 (see FIG. 6). Three cutouts 224 are equidistantly designed in the bottom face of the base 22 around the periphery of the base 22, to alternate with the three legs 28. Each cutout 224 is trapezoidal in shape so as to receive the locking portion 282 of a corresponding leg 28 therein, thus engagingly securing adjacent LEDs 20 with each other.

In assembly, the LEDs 20 are fixed to each other to form the LED unit 200; the locking portion 282 of each leg 28 of each LED 20 is accommodated into a corresponding cutout 244 of an adjacent LED 20, and the tab 264 of the second lead 26 of each LED 20 is received in the groove 244 of the first lead 24 of the adjacent LED 20. Then the locking portions 282 of the legs 28 are soldered in the cutouts 224 of the bases 22, to securely connect the LEDs 20 together to form the LED unit 200. The LED unit 200 is attached on the substrate 10 to cooperatively construct the LED assembly. At last, the first and second leads 24, 26 are soldered together to electrically connect the plurality of LEDs 20.

With the help of the space 248, during soldering of the first and second leads 24, 26, even though a quantity of the solder offered to the first and second leads 24, 26 exceeds a predetermined amount, the excess portion of the solder would not overflow to contaminate the LED assembly, particularly, the substrate 10. Thus, the top surface of the substrate 10 which supports the LEDs 20 thereon can be kept clean, and the problem caused by the overflowed solder on the substrate 10, such as a short circuit can be avoided.

In use, when the LED die 23 is activated to lighten, the heat generated by the LED die 23 is conducted to the substrate 10 via the base 22, while the current is conveyed to the LED die 23 through the first and second leads 24, 26. Since the first and second leads 24, 26 are spaced from the substrate 10, the pathway through which the current is supplied is separated from the pathway through which the heat is dissipated, the heat would not significantly affect the set value of the current supplied to the LED die 23; thus, the current is capable of being maintained in a relatively steady level. The steadily input current insures the LED die 23 emitting light with a constant intensity; a good illumination of the LED assembly is thus obtained, and a lifetime of the LED assembly is accordingly prolonged.

Alternatively, during assembling, the process of soldering the first and second leads 24, 26 together can be implemented before the LED unit 200 attached on the substrate 10; thus, the LED unit 200 is substantially completed prior to the LED assembly. Since the LED unit 200 has the first and second leads 24, 26 connected with each other to realize electrical connections, and the legs 28 locked with the bases 22 to realize mechanical connections; thus, if the bases 22 of the LED unit 200 can provide sufficient heat dissipation to the LED dies 23, no substrate 10 is needed, and the LED unit 200 can be utilized individually. The LEDs 20 of the individually utilized LED unit 200 can be freely arranged in various patterns as well as the number thereof according to different demands, without being restricted by a shape or a size of the substrate 10; therefore, a versatility of the LED unit 200 is obtained. Compared to the conventional LED assembly, which needs a printed circuit to electrically and mechanically support the LEDs, the LED unit 200 in accordance with the present invention does not need any support, whereby a cost of the LED assembly can be reduced.

Furthermore, the relationship and the number of the first and second leads 24, 26 and the legs 28 can be changed in accordance with different requirements. For example, the first lead 24 can be located adjacent to the second lead 26, and one of the three legs 28 can be removed for reducing a manufacture cost.

Figure 9:
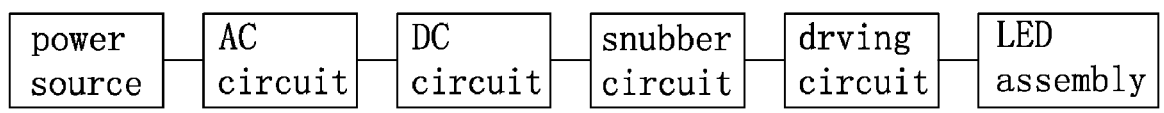
FIG. 9 is a schematic block view of a power supply circuit connected between a power source and the LED assembly, wherein a snubber circuit is connected between a DC circuit and a driving circuit of the power supply circuit.
Figure 10:
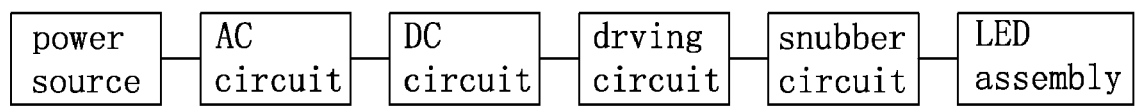
FIG. 10 is a view similar to FIG. 9, but the snubber circuit is positioned between the driving circuit and the LED assembly.

As illustrated in FIG. 9, the LED assembly can be connected to a snubber circuit to protect the LED die 23 from being damaged at the time when initially, electrically connecting the LED assembly to a power source. Conventionally, the LED assembly is sequentially connected to a driving circuit, a direct current (hereinafter is predigested to DC) circuit, an alternating current (hereinafter is predigested to AC) circuit, and a power source (such driving circuit, DC circuit and AC circuit are cooperatively alleged to a power supply circuit). The AC circuit inputs an AC into DC circuit from the power source, the DC circuit converts the AC to a DC, which is then conveyed to the LED assembly via the driving circuit. However, such power supply circuit can only control a current type and a current value, and cannot control a varied range of the current. Following a suddenly, electrically connecting action, the current varies dramatically from zero to a large value in a relatively short time, which input into the LED die 23 from the circuit supply circuit would damage the LED die 23. Therefore, in FIG. 9 of the present invention, the sunnber circuit is added between the DC circuit and the driving circuit, to relieve the sharply varied current to a gradually increased current, which smoothly input into the LED assembly would not damage the LED die 23. In operation, as soon as the LED assembly electrically connected, a sharply varied AC is produced and is conveyed to the DC circuit via the AC circuit. The DC circuit converts the sharply varied AC into a sharply varied DC, which is then input into the snubber circuit. After passing through the snubber circuit, the sharp variation of the DC is relieved, and the DC becomes gradually increased. The gradually increased DC is input into the LED assembly via the driving circuit, and enables the LED die 23 lighten from dark to bright slowly. Therefore, the damage caused by the current to the LED die 23 is prevented. Also, it can be apprehended by those skilled in the related art that such snubber circuit can be connected between the driving circuit and the DC circuit as well, which is shown in FIG. 10.

Figure 11:
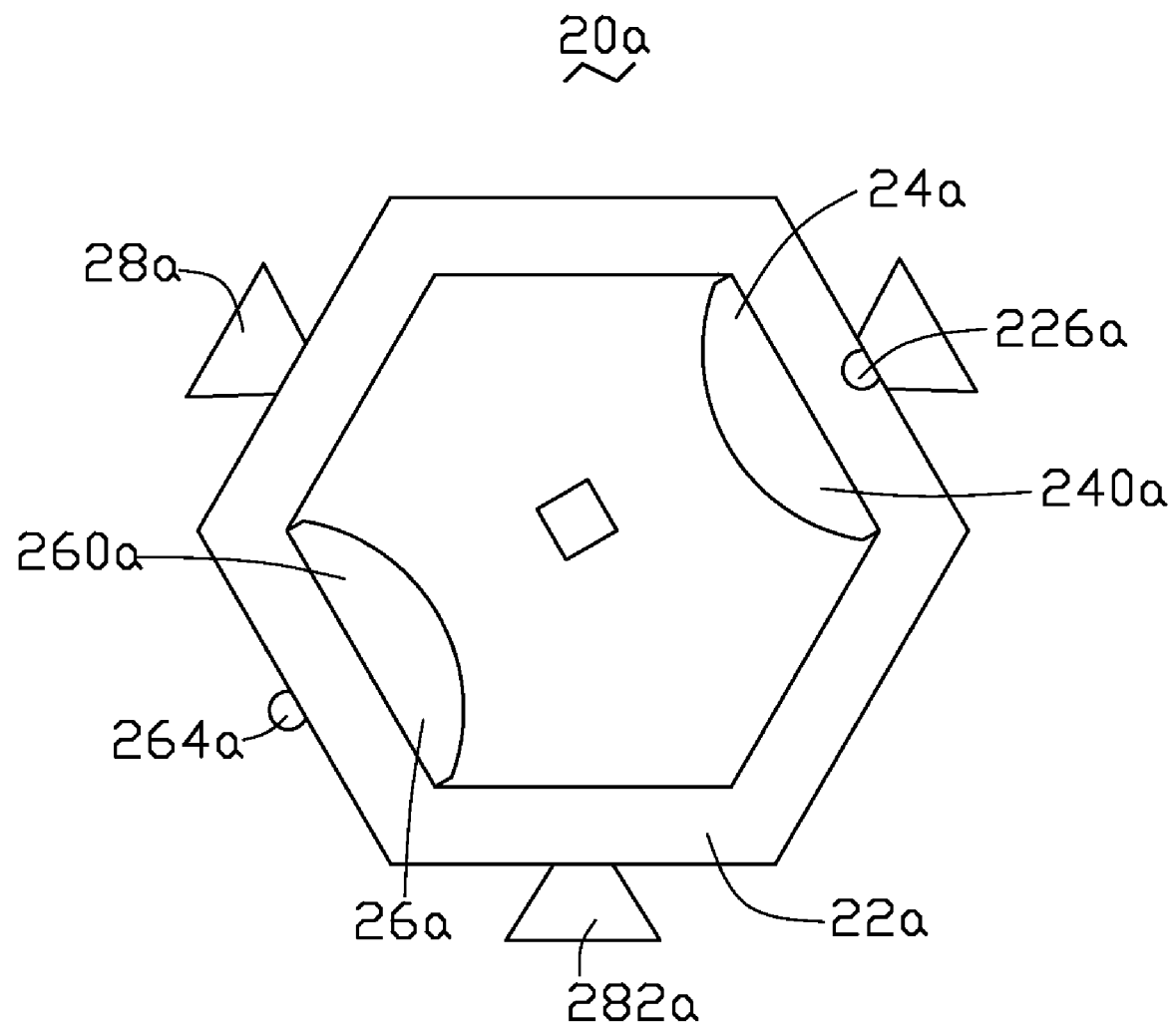
FIG. 11 is a view similar to FIG. 5 showing an LED in accordance with a second embodiment of the present invention, wherein a first lead, a second lead and legs of the LED are shorter than those of the LED of FIG. 5.

A distance between two adjacent LEDs 20 is associated with a length of the strip 280 of the leg 28 and a sum of lengths of respective portions of the first lead 24 and the second lead 26 extending outside the base 22. In order to obtain much more light per area, the LEDs 20 should abut against each other more intimately without the distance existing therebetween, or only a little distance therebetween. FIG. 11 schematically shows a second embodiment of the present invention, in which the configurations of the first and second leads 24a, 26a and the legs 28a are changed so as to hold adjacent LEDs 20a in intimate contact with each other. The first lead 24a of the LED 20a comprises a sheet 240a entirely received in a base 22a. The second lead 26a comprises a sheet 260a substantially accommodated within the base 22a, and a tab 264a extending outwardly beyond the base 22a. For realizing a connection between the first lead 24a and the second lead 26a of two adjacent LEDs 20a, a portion of the base 22a is recessed to form a trough 226a, in which an outmost part of the sheet 240a of the first lead 24a is exposed. Accordingly, each leg 28a only remains a locking portion 282a to be snugly fitted into a corresponding cutout (not shown) in an adjacent base 22a. Since the tab 264a of the second lead 26a of each LED 20a is fully received in the trough 226a of the base 22a of an adjacent LED 20a to electrically connect with the first lead 24a of the adjacent LED 20a, and the leg 28a completely received in the corresponding cutout of the base 22 of the adjacent LED 20a, confronting lateral sides of the two adjacent LEDs 20a are capable of abutting against each other intimately. Thus, the LEDs 20a can be arranged with a higher density, and an overall output intensity of the light is accordingly increased. On the other hand, supposed that the light produced per area can meet a lighting intensity requirement, the first and second leads 24, 26 and the legs 28 of the LEDs 20 of the first embodiment only need to be shorten, to avoid redesigning and remanufacturing of the base 22.

Figure 12:
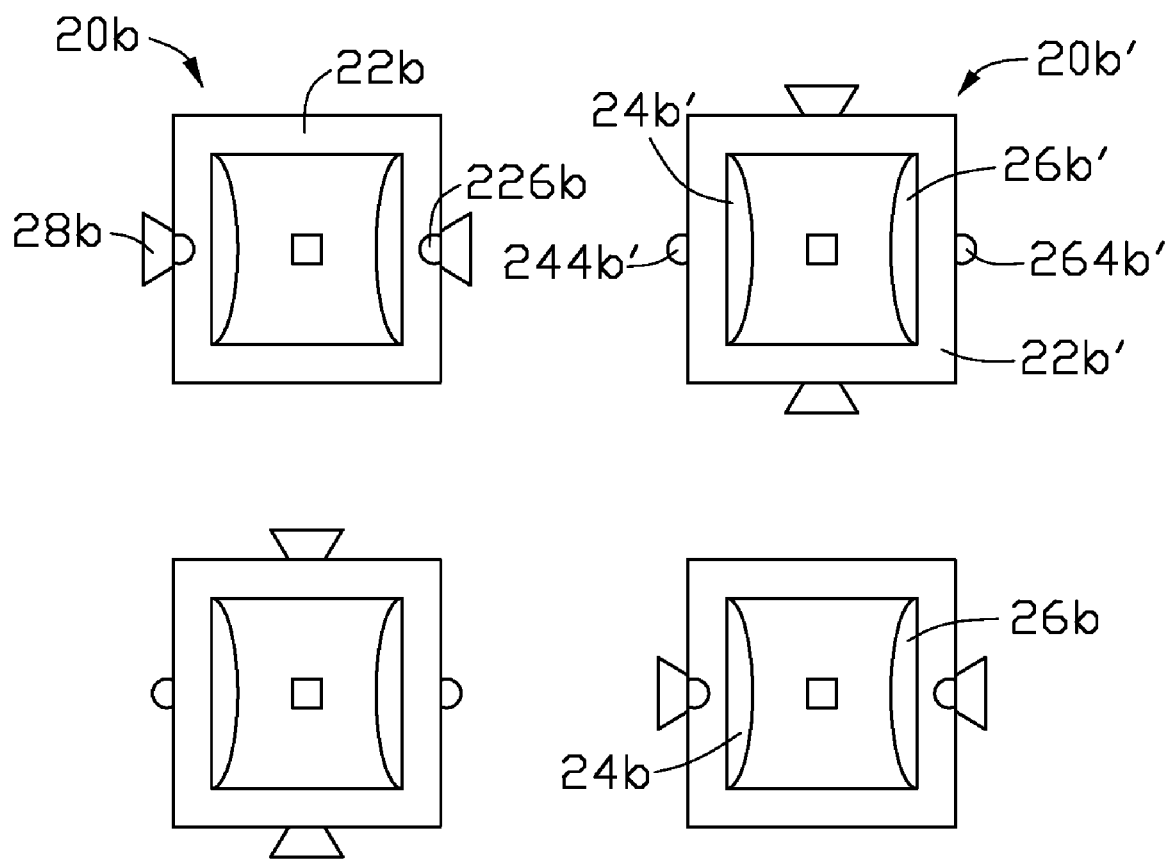
FIG. 12 is a top view of an LED unit in accordance with a third embodiment of the present invention.
Figure 13:
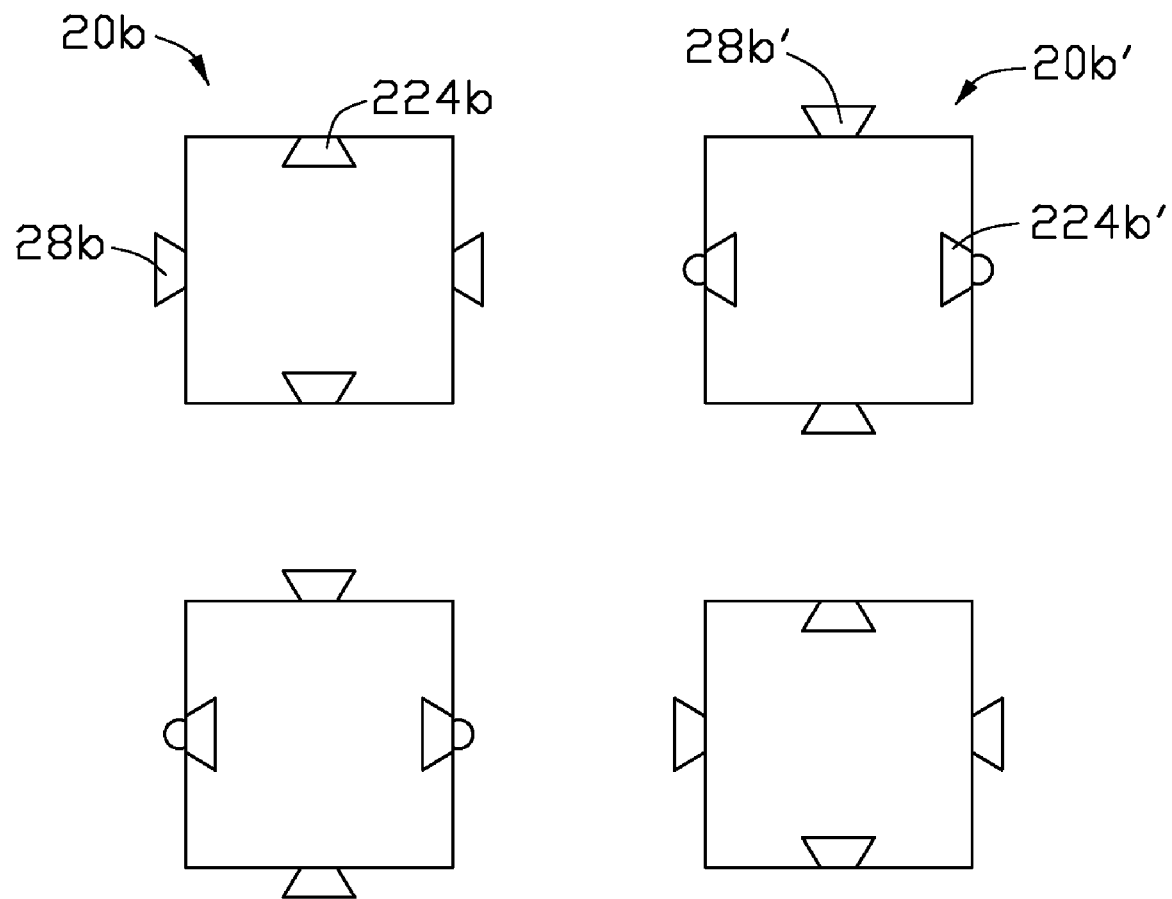
FIG. 13 is a bottom view of FIG. 12.
Figure 14:
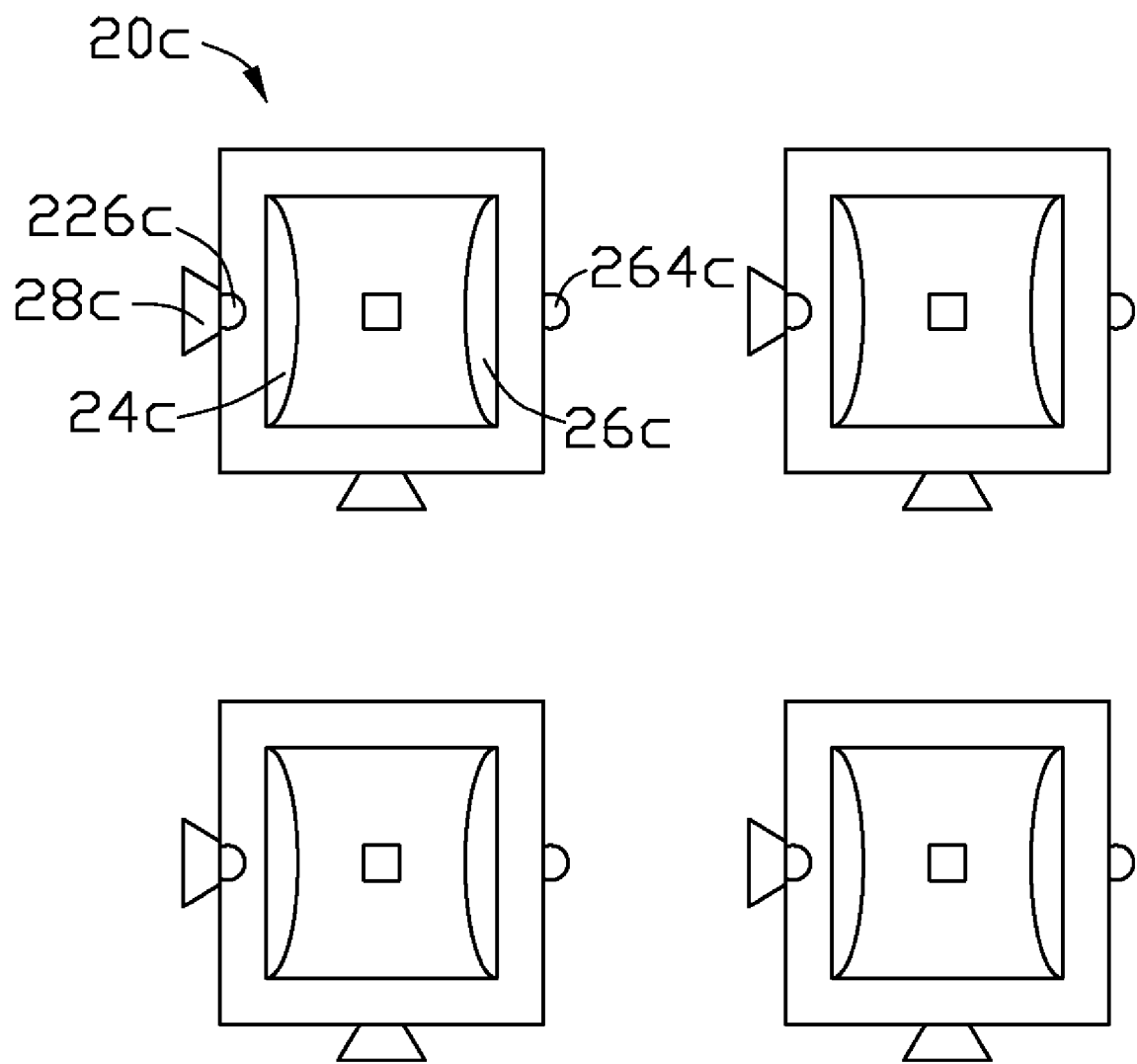
FIG. 14 is a top view of an LED unit in accordance with a forth embodiment of the present invention.
Figure 15:
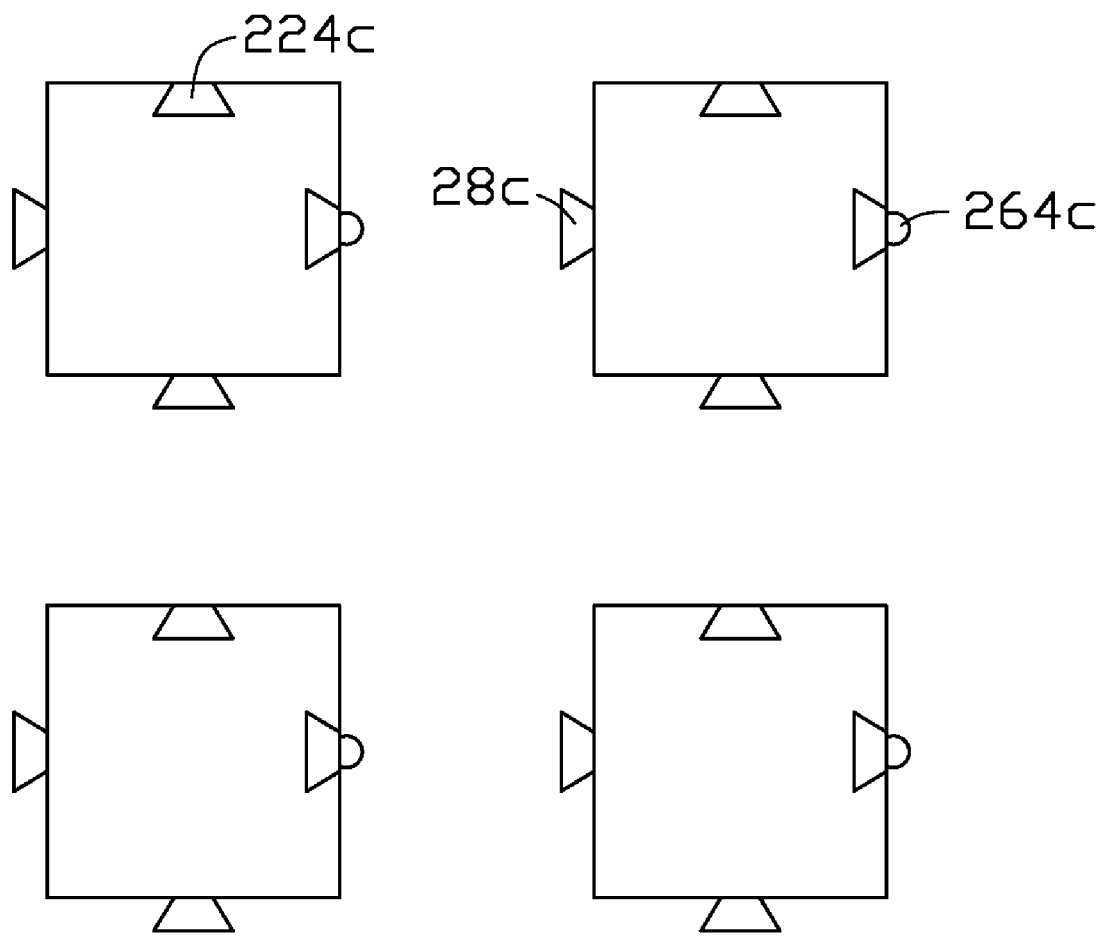
FIG. 15 is a bottom view of FIG. 14.

Note that a shape and a size of the base 22 of the first embodiment can be changed to various types according to different applications. For example, FIGS. 12-13 illustrate a third embodiment of the present invention, in which the base 22b, 22b' is in the form of a square, and has two legs 28b, 28b' formed from two opposite sides thereof and two cutouts 224b, 224b' defined at other two opposite sides thereof. In this embodiment there are two types of LEDs 20b, 20b': the first type LEDs 20b each have two troughs 226b defined at the two opposite sides of the base 22b to expose outermost parts of a first and second leads 24b, 26b; the second type LEDs 20b' each have two opposite tabs 244b', 246b' projecting outwardly from the first and second leads 24b', 26b' beyond the two opposite sides of the base 22b'. The tabs 244b', 264b' of the second type LED 20b' are received in the troughs 226b of an adjacent first type LED 20b and contact the first and second leads 24b, 26b of the first type LED 20b, to thereby electrically connect the first type and second type LEDs 20b, 20b'. The first type LEDs 20b and the second type LEDs 20b' are so engaged together that the legs 28b of each first type LED 20b are retained into the cutouts 224b' of two adjacent second type LEDs 20b', and the cutouts 224b of each first type LED 20b receive the legs 28b' of other two adjacent second type LEDs 20b' therein. Such mutual connections of the plurality of LEDs 20b, 20b' can also be characterized in that: the legs 28b of the first type LEDs 20b realize transverse connections, and the legs 28b' of the second type LEDs 20b' realize longitudinal connections. Furthermore, the LEDs 20b, 20b' with square bases 22b, 22b' can also be modified to have different configurations, which are illustrated in FIGS. 14-15 of the forth embodiment of the present invention, for facilitating a uniform design and manufacture of the LEDs 20b, 20b'. As shown in FIGS. 14-15, each LED 20c of the forth embodiment has two legs 28c formed from two adjacent sides of the base 22c, and two cutouts 224c defined at other two adjacent sides of the base 22c. Each LED 20c further forms a tab 264c of a second lead 26c extending outwardly beyond a side of the base 20c, and a trough 226c defined at an opposite side of the base 22c to expose an outmost part of the first lead 24c. The through 226c receives the tab 264c of an adjacent LED 20c. In assembly, the LEDs 20c mechanically engage with each other by fitting the legs 28c of each LED 20c into corresponding cutouts 224c of two adjacent LEDs 20c, and electrically couple with each other by soldering the tab 264c of each LED 20c in the trough 226c of an adjacent LED 20c. Due to the legs 28c of each LED 20c, both transverse and longitudinal connections of the LEDs 20c can be realized, meanwhile the LEDs 20 have the same configuration and structure.

Figure 16:
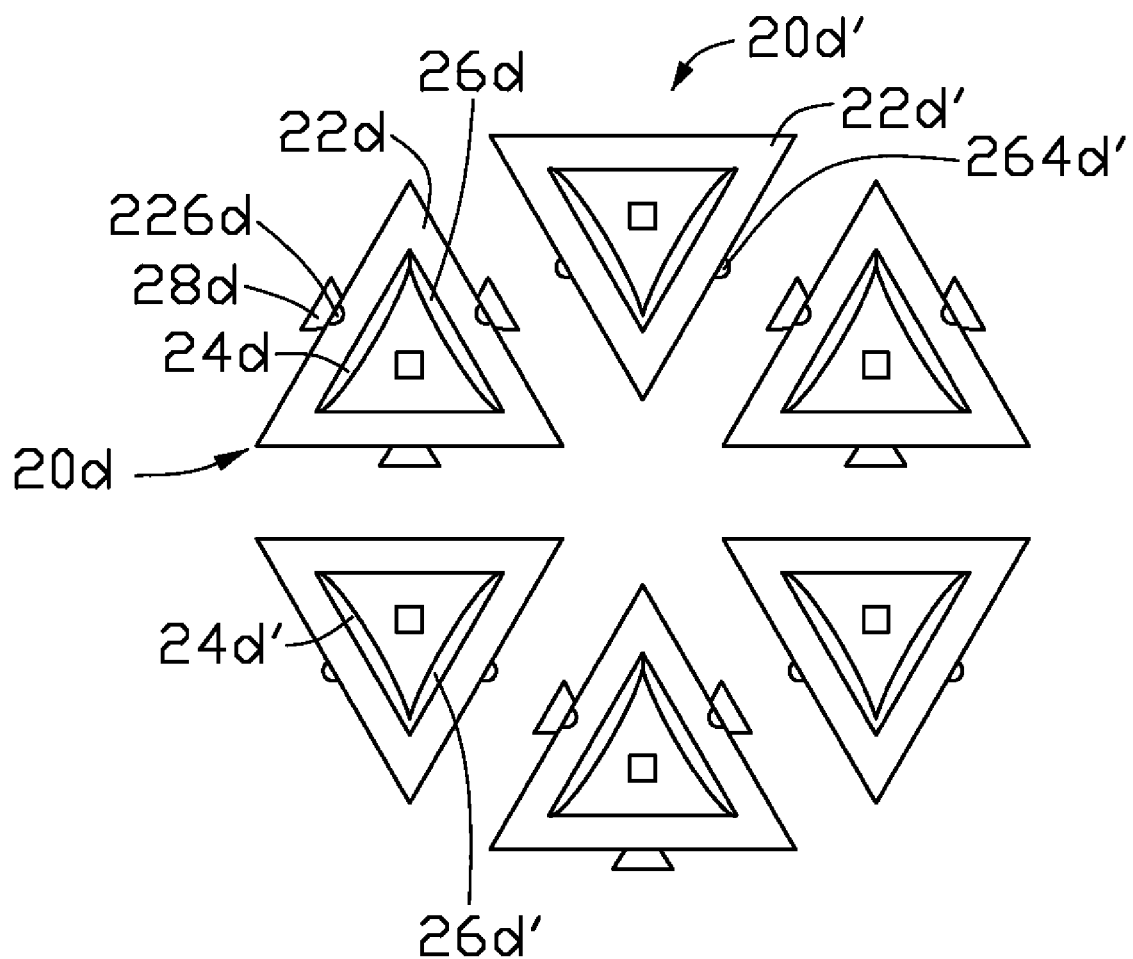
FIG. 16 is a top view of an LED unit in accordance with a fifth embodiment of the present invention.
Figure 17:
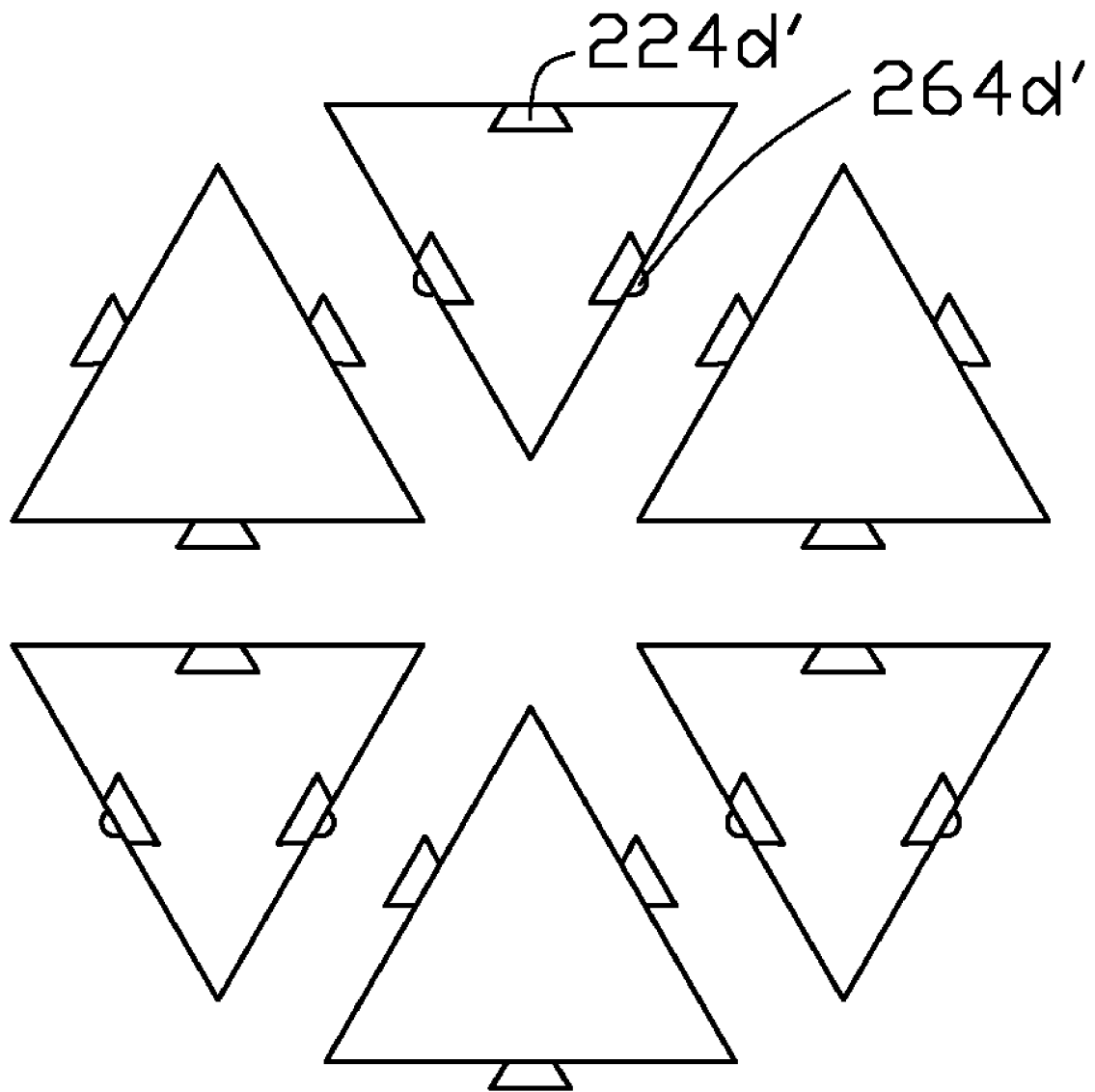
FIG. 17 is a bottom view of FIG. 16.
Figure 18:
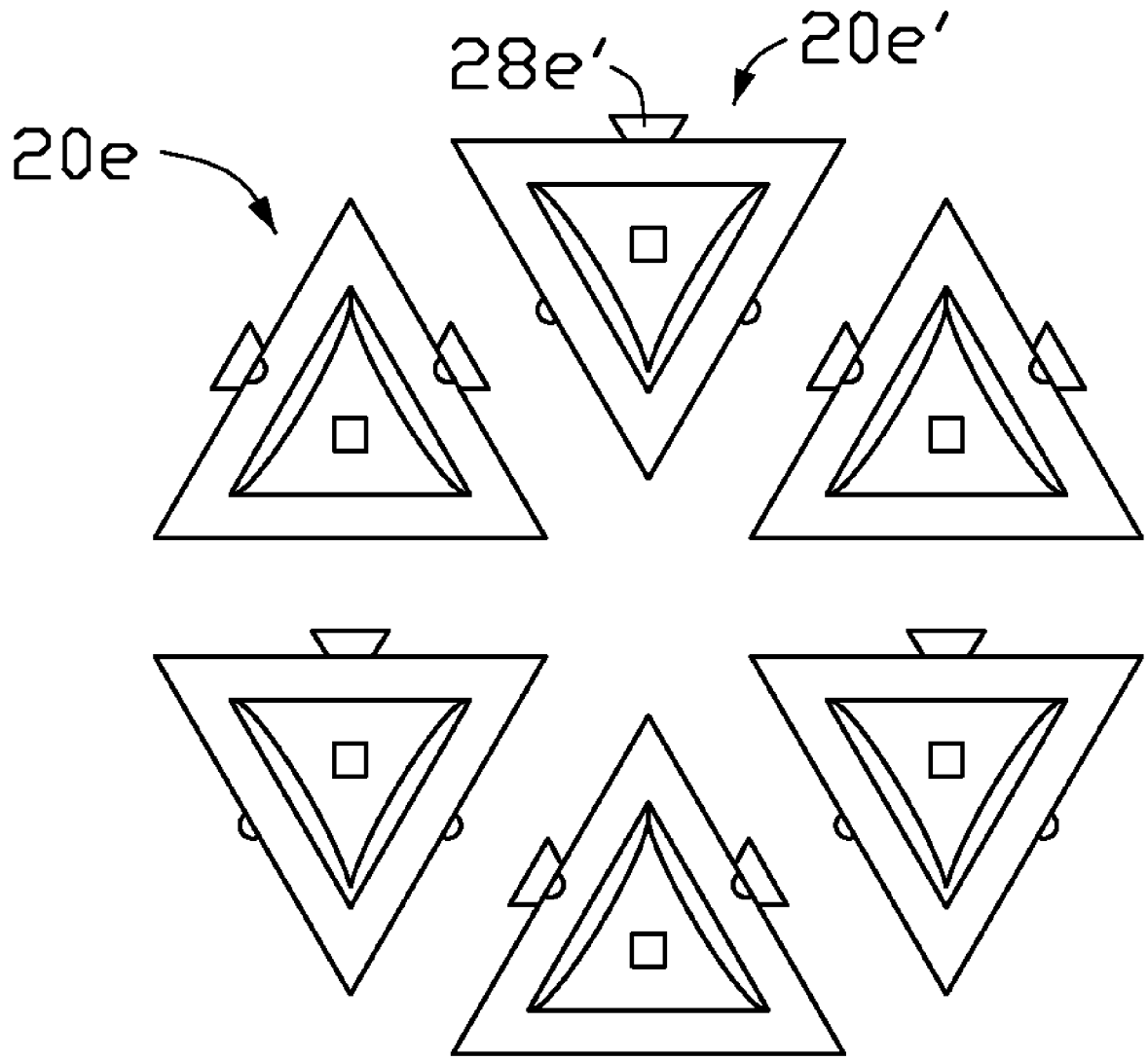
FIG. 18 is a top view of an LED unit in accordance with a sixth embodiment of the present invention.
Figure 19:
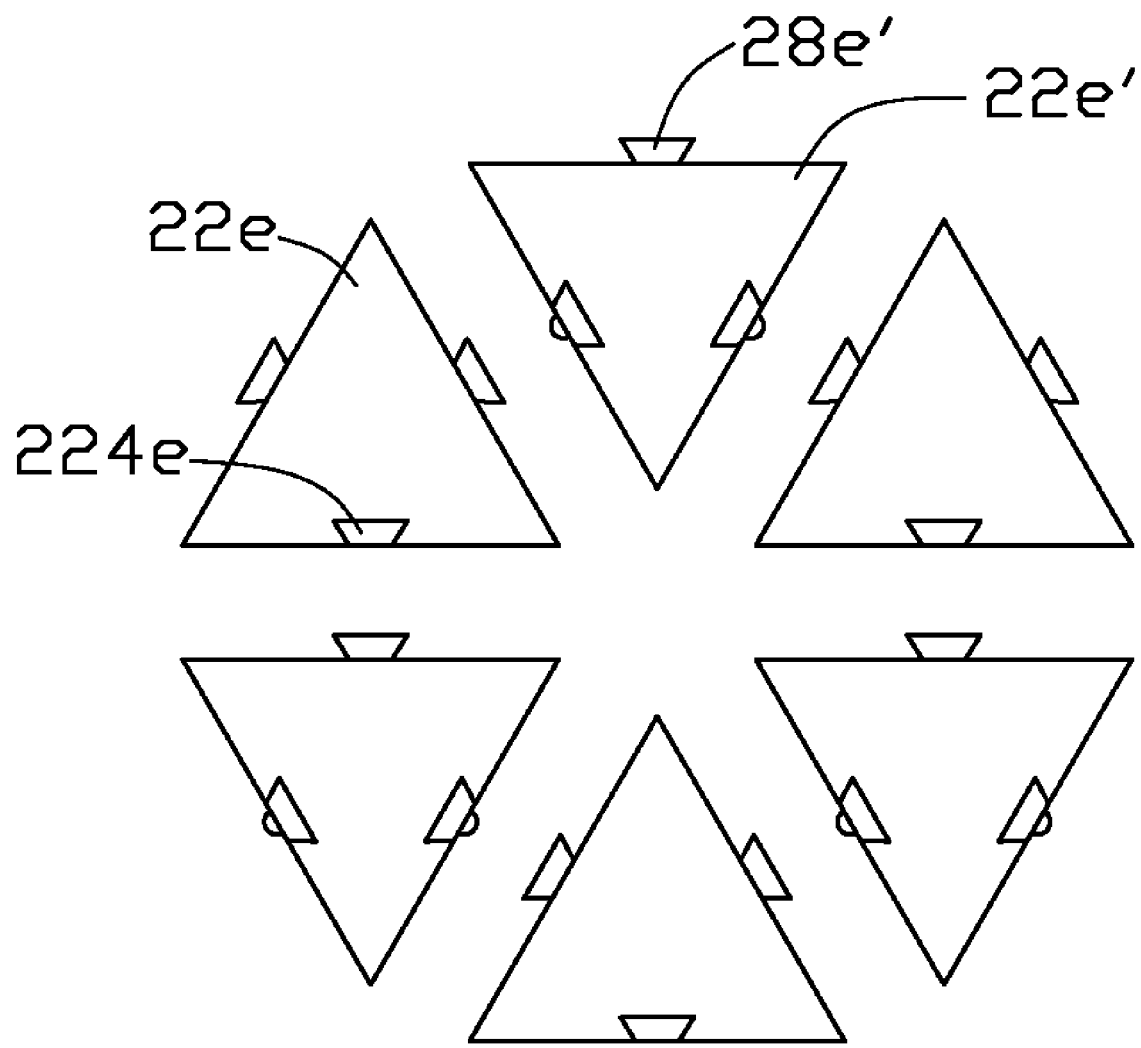
FIG. 19 is a bottom view of FIG. 18.

FIGS. 16-17 show a fifth embodiment of the present invention, in which the base 22d, 22d' is shaped to be triangle. Considering electrical and mechanical connections between the plurality of LEDs 20d, 20d', the LEDs 20d, 20d' should be designed to have two different configurations: a first type LEDs 20d each form three legs 28d respectively extending outwardly from three sides of the base 22d, and define two troughs 226d at two sides of the base 22d to expose outmost parts of a first lead 24d and a second lead 26d thereof; a second type LEDs 20d' each define three cutouts 224d' around a periphery of the base 22d' corresponding to the three legs 28d, and have two tabs 264d' of a first and second leads 24d', 26d' extending outwardly from the first and second leads 24d', 26d' beyond the two sides of the base 22d'. In assembly, the three legs 28d of each first type LED 20d are respectively engaged in corresponding three cutouts 224d' of three adjacent second type LEDs 20d', and the two troughs 226d respectively accommodate two corresponding tabs 264d' of two adjacent second type LEDs 20d' therein. In this embodiment, the first type LED 20d acts an active mechanical connector, and the second type LED 20d' is employed as a passive mechanical connector. Alternatively, one leg 28d of the first type LED 20d can be moved to the second type LED 20d', whereby each of the first type LED 20d and the second type LED 20d' acts as the active mechanical connector. Such variations of the legs 28d, 28d' between the first type LED 20d and the second type LED 20d' are shown in FIGS. 18-19 in accordance with a sixth embodiment of the present invention. A first type LED 20e forms a cutout 224e in a bottom of a base 22e corresponding to a location where the original leg 28d of the fifth embodiment is formed. Accordingly, a second type LED 20e' forms a leg 28e' at a location where the original cutout 224d' of the fifth embodiment is defined.

Figure 20:
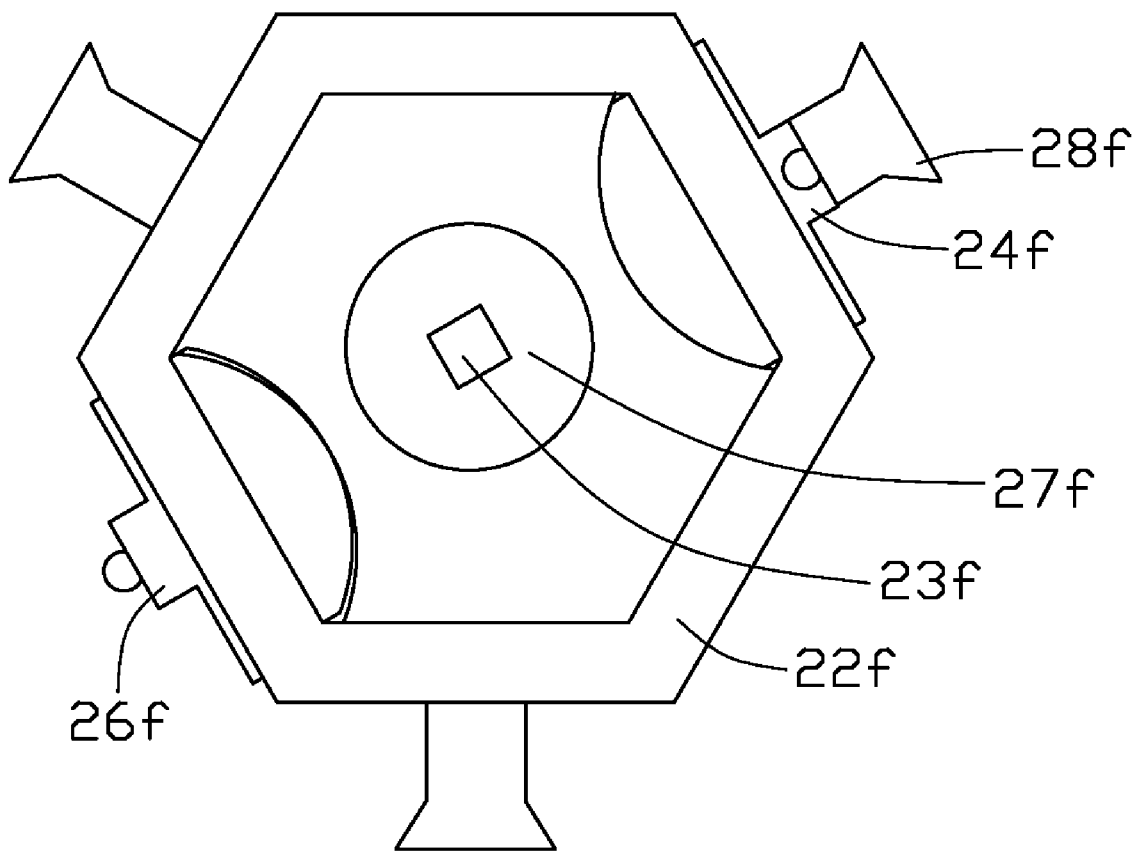
FIG. 20 is a top view of an LED in accordance with a seventh embodiment of the present invention.
Figure 21:
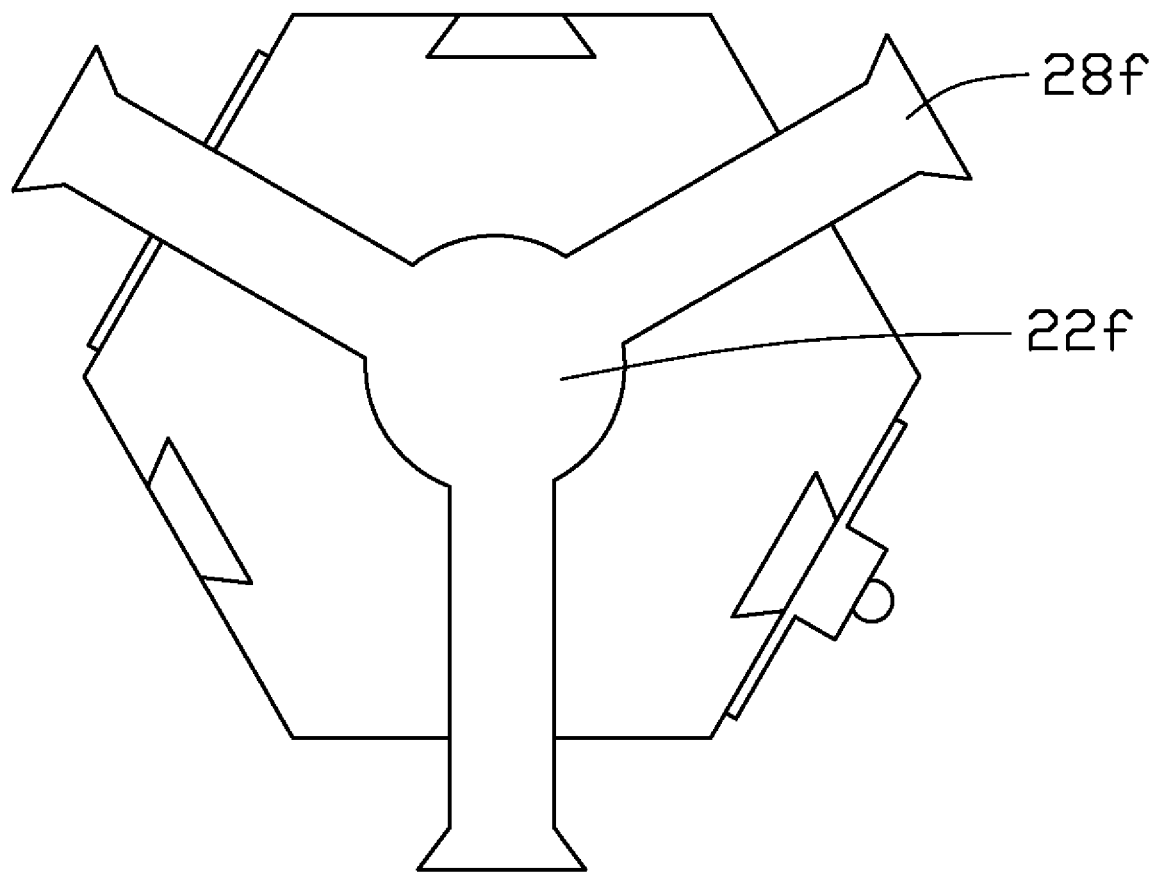
FIG. 21 is a bottom view of FIG. 20.

Furthermore, the base 22 of the first embodiment can be modified to another structure which is shown in FIGS. 20-21 in accordance with a seventh embodiment of the present invention. The differences of the seventh embodiment relative to the first embodiment are given below.

The base 22f of the LED 20f of the seventh embodiment is made of a thermally isolating and electrically insulating material such as epoxy, plastic and so on. A through hole (not labeled) is defined in a center of the base 22f of the LED 20f. Three channels (not labeled) are radially formed in a bottom of the base 22f, communicating with the through hole. A metal structure (not labeled), which is integrally formed by a post 27f and three legs 28f, is filled in the through hole and the three channels, and separated from the first lead 24f and the second lead 26f by the base 22f. Each leg 28f has an interior portion (not labeled) retained in a corresponding channel and coupling with a circumferential periphery of the post 27f, and an exterior portion (not labeled) extending outside the base 22f for locking with an adjacent LED 20f. The post 27f, the legs 28f and the base 22f contact the substrate 10 by bottoms thereof engaging with the top surface of the substrate 10. An LED die 23f is fixed on a top of the post 27f via a thermally conducting grease or glue. By using this construction, nearly all of heat generated by the LED die 23f is conducted to the substrate 10 via the post 27f and the legs 28f, while a current given to the LED die 23f is conveyed through a first and second leads 24f, 26f which are spaced from the post 27f and the legs 28f by the base 22f; thus, a current conducting pathway of the LED assembly and a heat conducting pathway thereof are substantially separated from each other, and the current can be maintained in a steady state without being affected by the heat. Note that all of other components in this embodiment are the same as those described in the first embodiment.

Figure 22:
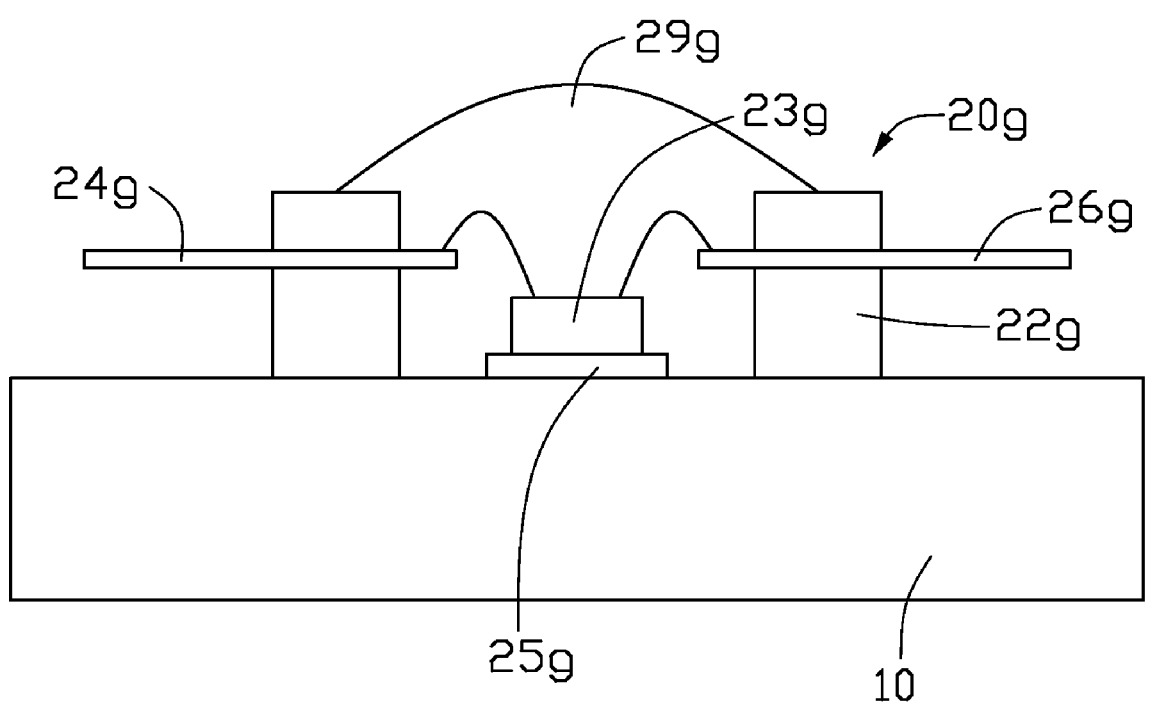
FIG. 22 is a cross-sectional view of an LED assembly in accordance with an eighth embodiment of the present invention.
Figure 23:
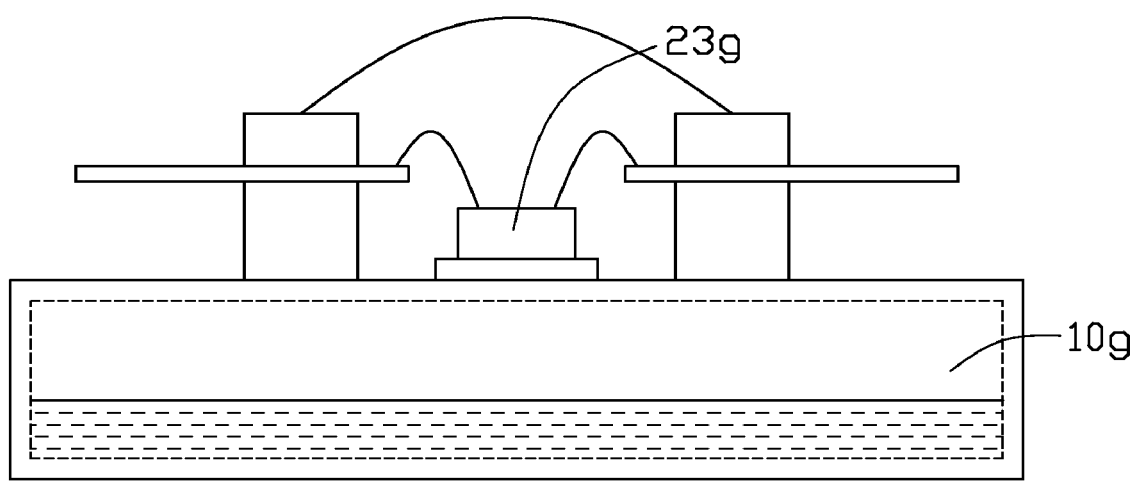
FIG. 23 is a view similar to FIG. 22, wherein a substrate of the LED assembly contains a coolant therein.

Referring to FIG. 22, which shows an LED assembly in accordance with an eighth embodiment of the present invention. In order to conduct heat generated by an LED die 23g to the substrate 10 more rapidly, a portion of a base 22g placed between the LED die 23g and the substrate 10 is omitted, while the LED die 23 is directly bonded on the top face of the substrate 10 via a kind of heat conducting adhesive 25g. Preferably, a thickness of the heat conducting adhesive 25g is selected to be less than 0.01 inches, for obtaining a balance between a good heat conducting capability and a sufficient gluing force. The base 22g of each LED 20g is annular to spacedly surround the LED die 23g. A first lead 24g and a second lead 26g are respectively inserted into the base 22g with inner parts (not labeled) thereof being surrounded by the base 22g and outer parts (not labeled) thereof hovering over the substrate 10. The LED die 23g is electrically connected to the inner parts of the first and second leads 24g, 26g via golden wires (not labeled). An encapsulant 29g envelops the LED die 23g and the inner parts of the first and second leads 24g, 26g therein to protect the LED die 23g from contamination and damage. Referring to FIG. 23, for more efficiently deriving heat from the LED die 23g, such solid metal substrate 10 can be replaced by a hollow substrate 10g which transfers heat by using a phase change of a working fluid. The substrate 10g can be a flat vapor chamber or a heat pipe. The substrate 10g can further connect with a heat sink (not shown) to disperse heat absorbed thereby to atmosphere, whereby the heat can be dissipated timely and sufficiently because of a large heat dissipating area of the heat sink.

Figure 24:
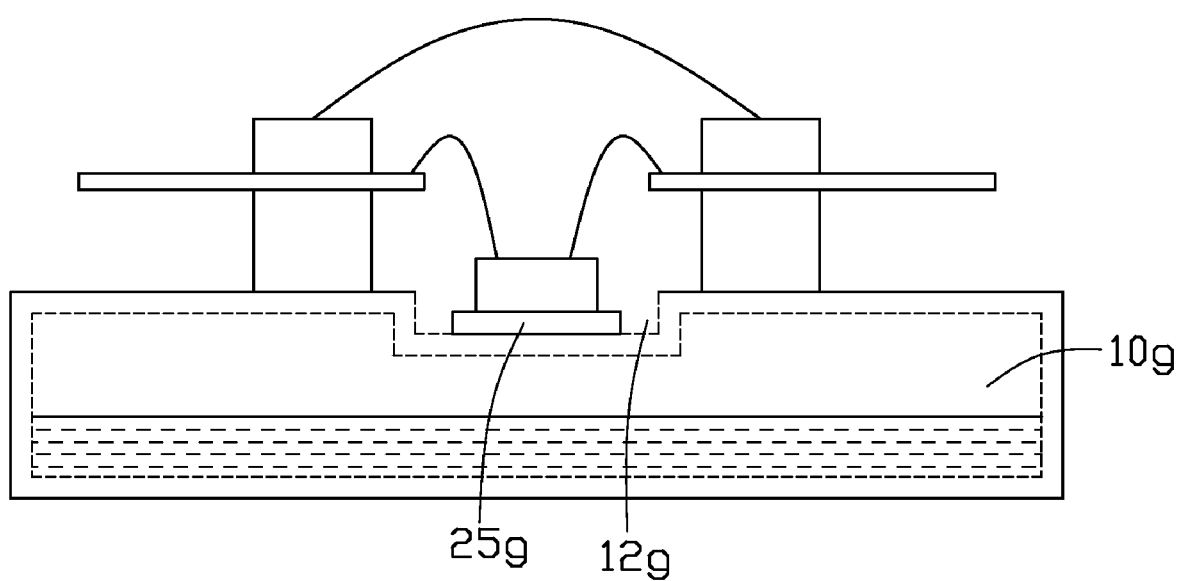
FIG. 24 is a view similar to FIG. 23 with a part of the substrate punched to form a concave.

As viewed from FIG. 24, furthermore, the substrate 10g can be stamped to form a plurality of concaves 12g (only one shown) at spots where the LED dies 23g are mounted, whereby the LED dies 23g can be accurately positioned at predetermined locations of the substrate 10g. On the other hand, such concave 12g is able to contain the adhesive 25g therein for preventing the adhesive 25g from overflowing to other parts of the substrate 10g.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An LED unit comprising:
   a plurality of LEDs each comprising:
      a chassis;
      an LED die mounted on the chassis;
      a first electrical lead and a second electrical lead secured to the chassis to be in electrical connection with the LED die; and
      an encapsulant encapsulating the LED die;
      wherein the first electrical lead of the each of the plurality of LEDs is coupled to the second electrical lead of an adjacent one of the plurality of LEDs to thereby electrically connect the plurality of LEDs, and the chassis of the each of the plurality of LEDs is directly coupled to the chassis of the adjacent one of the plurality of LEDs to thereby mechanically connect the plurality of LEDs.

2. The LED unit as claimed in claim 1, wherein the chassis comprises a base supporting the LED die thereon, and a plurality of legs extending from the base thereof to lock with an adjacent base.

3. The LED unit as claimed in claim 2, wherein the plurality of legs extends radially from a periphery of the base, and is spaced from the first electrical lead and the second electrical lead.

4. The LED unit as claimed in claim 2, wherein the plurality of legs each comprise a locking portion substantially retained into the adjacent base.

5. The LED unit as claimed in claim 4, wherein the peripheries of adjacent bases intimately abut against each other.

6. The LED unit as claimed in claim 5, wherein the base defines a trough therein to expose the first electrical lead located within the base, the second electrical lead has a portion extending beyond the base to be received in the trough in the adjacent base to thereby contact the first electrical lead in the adjacent base.

7. The LED unit as claimed in claim 4, wherein the each of the plurality of legs further comprises a strip interconnecting the base and the locking portion thereof, the strip defining a distance between every two adjacent ones of the plurality of LEDs.

8. The LED unit as claimed in claim 7, wherein each of the first electrical lead and the second electrical lead has an external portion projecting from the base, the first electrical lead in the base being connected to the second electrical lead in the adjacent base at a position where the external portions are formed.

9. The LED unit as claimed in claim 2, wherein the base has a polygonal configuration.

10. The LED unit as claimed in claim 9, wherein a shape of the base is selected from one of triangle, square, and hexagon.

11. The LED unit as claimed in claim 2, wherein the first electrical lead and the second electrical lead are substantially parallel to the plurality of legs.

12. An LED unit comprising:
a plurality of LEDs each comprising:
an LED die;
a member enveloping the LED die;
a pair of leads secured in the member, each of the pair of leads electrically connecting with the LED die, and coupling to a corresponding one of the pair of leads of an adjacent LED; and
a plurality of legs extending from the member, wherein each of the plurality of legs has a locking portion fixed into an adjacent member.

13. The LED unit as claimed in claim 12, wherein the members of the plurality of LEDs are in intimate contact with each other.

14. The LED unit as claimed in claim 12, wherein the members of the plurality of LEDs are spaced from each other via the plurality of legs.

15. The LED unit as claimed in claim 12, wherein each member comprises a base which is shaped to be one of triangle, square, and hexagon.

16. The LED unit as claimed in claim 15, wherein the pair of leads are located near a top end of the base, and the plurality of legs is located next to a bottom end of the base and spaced from the pair of leads.

17. The LED unit as claimed in claim 15, wherein the base defines a plurality of trapezoidal cutouts recessed in the bottom end around a periphery thereof, the locking portion of the each of the plurality of legs being completely received in a corresponding cutout in an adjacent base.

18. An LED unit comprising:
a plurality of LEDs interlocking with each other, each LED comprising:
a base having outwardly projecting legs and defining cutouts therein;
an LED die mounted on the base;
electrode leads extending horizontally in the base for electrically connecting with the LED die to supply a power to the LED die; and
an encapuslant encapsulating the LED die therein;
wherein the legs of one of the LEDs are fittingly snapped in corresponding cutouts of neighboring LEDs whereby the LEDs are interlocked together to form the LED unit.

19. The LED unit as claimed in claim 18, wherein the electrode leads are positioned at a level above that of the legs.

20. The LED unit as claimed in claim 18, wherein the legs and the cutouts are alternated with each other along a circumference of the base.

* * * * *